(12) United States Patent
Ono

(10) Patent No.: US 9,543,184 B2
(45) Date of Patent: Jan. 10, 2017

(54) ELECTROSTATIC CHUCK

(75) Inventor: Hiroshi Ono, Kyoto (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 67 days.

(21) Appl. No.: 14/373,976

(22) PCT Filed: Jun. 27, 2012

(86) PCT No.: PCT/JP2012/066397
§ 371 (c)(1),
(2), (4) Date: Nov. 6, 2014

(87) PCT Pub. No.: WO2013/111363
PCT Pub. Date: Aug. 1, 2013

(65) Prior Publication Data
US 2015/0049410 A1    Feb. 19, 2015

(30) Foreign Application Priority Data
Jan. 26, 2012    (JP) .................. 2012-014336

(51) Int. Cl.
*H01L 21/683* (2006.01)
*H02N 13/00* (2006.01)

(52) U.S. Cl.
CPC .......... *H01L 21/6833* (2013.01); *H02N 13/00* (2013.01)

(58) Field of Classification Search
CPC combination set(s) only.
See application file for complete search history.

(56) References Cited

U.S. PATENT DOCUMENTS

| | | | |
|---|---|---|---|
| 5,998,320 A * | 12/1999 | Yamada | C04B 35/581 501/153 |
| 6,001,760 A | 12/1999 | Katsuda et al. | |
| 6,166,432 A | 12/2000 | Ohno et al. | |
| 6,174,583 B1 * | 1/2001 | Yamada | C04B 35/581 264/642 |
| 6,486,085 B1 | 11/2002 | Katsuda et al. | |
| 2005/0152089 A1 | 7/2005 | Matsuda et al. | |
| 2009/0199765 A1 | 8/2009 | Bhatnagar | |
| 2009/0310274 A1 | 12/2009 | Koyama et al. | |

(Continued)

FOREIGN PATENT DOCUMENTS

| | | |
|---|---|---|
| CN | 101946315 A | 1/2011 |
| CN | 102834913 A | 12/2012 |

(Continued)

OTHER PUBLICATIONS

Taiwanese Office Action with English concise explanation, Taiwanese Patent Application No. 102102368, Jan. 14, 2015, 10 pgs.

(Continued)

*Primary Examiner* — Thienvu Tran
*Assistant Examiner* — Angela Brooks
(74) *Attorney, Agent, or Firm* — Volpe and Koenig, P.C.

(57) ABSTRACT

The present invention is an electrostatic chuck including a ceramic base body and an adsorption electrode provided inside of or on the lower surface of the ceramic base body and having a portion where a Mn content is $1\times10^{-4}\%$ by mass or less in a region from the upper surface of the ceramic base body to the adsorption electrode.

6 Claims, 3 Drawing Sheets

(56) References Cited

U.S. PATENT DOCUMENTS

| | | | | |
|---|---|---|---|---|
| 2011/0239446 A1* | 10/2011 | Morishima | ......... | H01M 4/0404 |
| | | | | 29/623.5 |
| 2011/0287270 A1* | 11/2011 | Tsurumi | .................... | C25D 9/04 |
| | | | | 428/457 |
| 2013/0120896 A1* | 5/2013 | Ono | .................... | H01L 21/6833 |
| | | | | 361/233 |

FOREIGN PATENT DOCUMENTS

| | | |
|---|---|---|
| JP | 09-315867 A | 12/1997 |
| JP | 10-072260 A | 3/1998 |
| JP | 2001-244321 A | 9/2001 |
| JP | 2005-210077 A | 8/2005 |
| JP | 2008-251737 A | 10/2008 |
| JP | 2008-277862 A | 11/2008 |
| JP | 4236292 B2 | 12/2008 |
| JP | 2009-302347 A | 12/2009 |
| JP | 4447750 B2 | 1/2010 |
| JP | 2011-049196 A | 3/2011 |
| JP | 2011-512034 A | 4/2011 |
| TW | 403730 | 9/2000 |

OTHER PUBLICATIONS

International Search Report, PCT/JP2012/066397, Sep. 6, 2012, 2 pgs.
Japanese Office Action, Japanese Patent Application No. 2013-555099, Sep. 1, 2015, 4 pgs.
Korean Office Action with concise English explanation, Korean Patent Application No. 10-2014-7018806, Oct. 8, 2015, 6 pgs.
Chinese Office Action with English concise explanation, Chinese Patent Application No. 201280068046.6, Dec. 16, 2015, 8 pgs.
Japanese Office Action (Information Offer) with English concise explanation, Japanese Patent Application No. 2013-555099, Aug. 17, 2016, 6 pgs.
Chinese Office Action with English concise explanation, Chinese Patent Application No. 201280068046.6, Jul. 13, 2016, 7 pgs.
Japanese Office Action with English concise explanation, Japanese Patent Application No. 2013-555099, Apr. 5, 2016, 5 pgs.

* cited by examiner (a)

(b)

(a)

(b)

(a)

(b)

(a)

(b)

(c)

(d)

ELECTROSTATIC CHUCK

TECHNICAL FIELD

The present invention relates to an electrostatic chuck for use in film forming devices, such as a PVD device, a CVD device, an ion plating device, and a vapor deposition device, exposure devices, and etching devices.

BACKGROUND ART

Heretofore, in the film forming devices, such as a PVD device, a CVD device, an ion plating device, and a vapor deposition device, exposure devices, and etching devices, a subject to be processed, such as a silicon wafer, has been forcibly adsorbed to an evenly and smoothly finished surface of a plate-like object in order to fix the subject to be processed with good accuracy. As an adsorption means, an electrostatic chuck utilizing electrostatic adsorption force has been used.

In the electrostatic chuck for use in these film forming devices and etching devices, one principal surface (one largest surface) of a plate-like ceramic base body containing ceramics serves as a placement surface (adsorption surface) and an adsorption electrode is provided inside of or on the other principal surface (the other largest surface) of the ceramic base body, for example. Thus, a subject to be processed can be forcibly adsorbed to the placement surface and fixed by applying a DC voltage to the adsorption electrode to develop electrostatic adsorption force, such as Coulomb force generated by dielectric polarization and Johnson-Rahbek force generated by a slight leakage current, between the adsorption electrode and the subject to be processed.

In the electrostatic chuck, a lift pin for removing the subject to be processed from the placement surface is provided in such a manner that the lift pin can be desirably projected from a circumferential portion of the placement surface, the portion corresponding to a circumferential portion of the subject to be processed.

It is known that in an existing electrostatic chuck for use in plasma treatment, so-called residual adsorption occurs in which the adsorption force remains even after the DC voltage application to the adsorption electrode is canceled. The residual adsorption results from the fact that when electrons are injected from plasma into the subject to be processed, fixed charges (holes) are generated in the ceramic base body, and then the fixed charges (holes) remain in the ceramic base body even after the DC voltage application is canceled.

Herein, there has been a problem in that when it is attempted to remove the subject to be processed from the placement surface with the lift pin in the state where the residual adsorption force is high, the subject to be processed is deformed or broken.

Then, a method is proposed in which a charging control electrode that contacts with an adsorbed wafer is provided on a placement surface of an electrostatic chuck and the charging control electrode is operated as a ground electrode when releasing the adsorption (refer to PTL 1). By the use of such a fixed charge removing method, deformation or breakage of a subject to be processed can be suppressed.

CITATION LIST

Patent Literature

PTL 1: Japanese Unexamined Patent Application Publication No. 2008-251737

SUMMARY OF INVENTION

Technical Problem

However, the electrostatic chuck described in PTL 1 has a problem in that when processing, such as film formation, is repeatedly performed, the residual adsorption gradually increases, so that a wafer is difficult to be removed.

The present invention has been made in view of the above-described problem. It is an object of the present invention to provide an electrostatic chuck in which the residual adsorption does not easily increase with time.

Solution to Problem

The present invention is an electrostatic chuck including a ceramic base body and an adsorption electrode provided inside of or on the lower surface of the ceramic base body and having a portion where a Mn content is $1 \times 10^{-4}$% by mass or less in a region from the upper surface of the ceramic base body to the adsorption electrode.

Advantageous Effects of Invention

According to the present invention, the increase in residual adsorption with time is suppressed, and therefore a wafer can be easily removed, and thus an electrostatic chuck from which a subject to be processed is easily removed can be realized.

DESCRIPTION OF EMBODIMENTS

Hereinafter, an embodiment of the electrostatic chuck of the present invention is described in detail with reference to the drawings.

Figure 1:
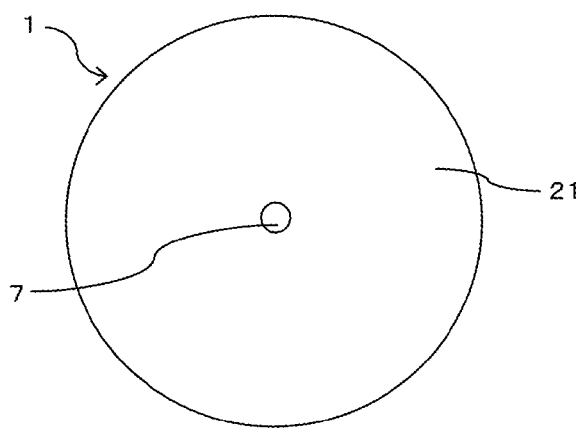
FIG. 1 illustrates views of an electrostatic chuck according to an embodiment of the present invention, in which (a) is a top view of the electrostatic chuck and (b) is a longitudinal section of the electrostatic chuck and a subject to be processed.
Figure 1:
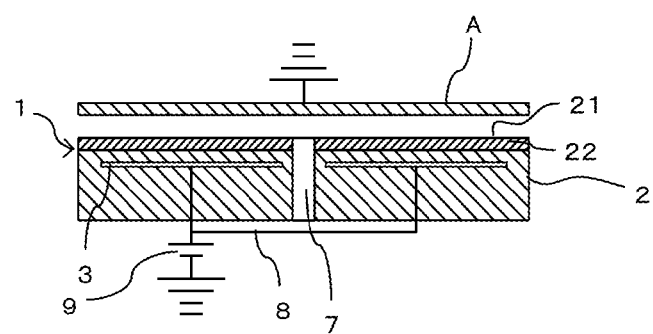

FIG. 1 illustrates views of an electrostatic chuck according to an embodiment of the present invention, in which (a) is a top view of the electrostatic chuck and (b) is a longitudinal section of the electrostatic chuck and a subject to be processed.

An electrostatic chuck 1 of an example illustrated in FIG. 1 includes a ceramic base body 2 and an adsorption electrode 3 provided inside of or on the lower surface of the ceramic base body 2 and has a portion where a Mn content is $1 \times 10^{-4}$% by mass or less in a region from the upper surface of the ceramic base body 2 to the adsorption electrode 3.

Specifically, the ceramic base body 2 illustrated in FIG. 1 is formed into a disk shape having almost the same size as that of a subject to be processed A, such as a silicon wafer. The upper surface of the ceramic base body 2 which is one principal surface serves as a placement surface 21 for the subject to be processed A.

In FIG. 1, the adsorption electrode 3 containing metal, such as platinum or tungsten, is embedded inside of the ceramic base body 2. The adsorption electrode 3 may be provided in such a manner as to expose to the lower surface which is the other principal surface of the ceramic base body 2 but is preferably embedded inside of the ceramic base body 2 as illustrated in the figure.

A lead 8 is connected to the adsorption electrode 3. The adsorption electrode 3 is connected to a direct-current power supply 9 through the lead 8. On the other hand, the subject to be processed A that is adsorbed to the placement surface 21 is directly connected to the ground or electrically connected thereto through plasma. Thus, electrostatic adsorption force is developed between the adsorption electrode 3 and the subject to be processed A, so that the adsorption/fixation of the subject to be processed A is achieved.

Moreover, a gas introduction hole 7 which penetrates from the other principal surface (lower surface in the figure) to the one principal surface (upper surface in the figure) is formed in the central portion of the ceramic base body 2. Moreover, gas flow paths (not illustrated) are formed in a region near the placement surface 21, and the gas flow paths communicate with the gas introduction hole 7. When the subject to be processed A is adsorbed to the placement surface 21, a coolant gas, such as helium gas, is supplied from the gas introduction hole 7 to a space formed by the subject to be processed A and the gas flow paths, whereby the heat transfer between the gas flow paths and the subject to be processed A and the heat transfer between the placement surface 21 and the subject to be processed A can be improved, so that the subject to be processed A has the distribution of temperature that is controlled to be uniform.

Examples of materials of the ceramic base body 2 include those containing at least one of $Al_2O_3$, AlN, and $Al_2O_3$-$TiO_2$ as the main component. Herein, in the case where the ceramic base body 2 contains aluminum oxide ceramics, the ceramic base body 2 preferably has a portion containing a material containing aluminum oxide synthesized from ammonium dawsonite ($NH_4AlCO_3(OH)_2$), for example, as the starting material in the region from the upper surface (placement surface 21) of the ceramic base body 2 to the adsorption electrode 3. When $Al_2O_3$ refined from bauxite is contained as the starting material, the content of Mn mixed as inevitable impurities increases. On the other hand, when the above-described material is contained, the ceramic base body 2 has a portion where a Mn content is $1 \times 10$-4% by mass or less in the region from the upper surface of the ceramic base body 2 to the adsorption electrode 3. The above-described portion preferably contains a very high purity aluminum oxide in which each of Fe, Cr, alkaline metal, and alkaline-earth metal is also $10 \times 10$-4% by mass or less.

Since the ceramic base body 2 has the portion where a Mn content is $1 \times 10$-4% by mass or less in the region from the upper surface of the ceramic base body 2 to the adsorption electrode 3, the number of positive holes in this portion in the ceramic base body 2 does not increase, and therefore a good flow of charges is achieved. Therefore, an increase in residual adsorption with time is suppressed, and the removal of a wafer can be facilitated.

Herein, a mechanism of developing the residual adsorption affected by the Mn content is considered to be as follows, for example.

When the ceramic base body 2 contains ceramics containing a slight amount of Mn, the irradiation with plasma oxidizes Mn from $Mn^{2+}$ to $Mn^{3+}$ using the energy of the plasma as the excitation energy. In this case, charges emitted from Mn are supplied to reduce other metals, such as $Fe^{3+}$ and $Cr^{3+}$, for example, and then oxygen vacancies (positive holes) are generated in Mn oxide. Then, the positive holes serve as a factor of weak surface current. It is considered that the surface current develops as the residual adsorption. The generation of the positive holes not only occurs in the top layer of the ceramic base body 2 but occurs with time inside the ceramic base body 2.

It is considered that such a phenomenon is likely to occur when the ceramic base body 2 contains at least one of $Al_2O_3$, AlN, and $Al_2O_3$-$TiO_2$ as the main component. This is because these ceramics contain $Al_2O_3$ refined from bauxite as the starting material in many cases, and the oxygen vacancies generated by Mn mixed as inevitable impurities in the ceramic base body 2 serve as charged particles (holes) and often cause leakage current to occur.

On the other hand, the ceramic base body 2 has the portion where a Mn content is $1 \times 10$-4% by mass or less in the region from the upper surface (placement surface 21) of the ceramic base body 2 to the adsorption electrode 3, the generation of positive holes is suppressed and the increase in residual adsorption with time can be suppressed.

As an example in which the ceramic base body 2 has the portion where a Mn content is $1 \times 10$-4% by mass or less in the region from the upper surface (placement surface 21) of the ceramic base body 2 to the adsorption electrode 3, an example is mentioned in which a portion including the placement surface 21 and a region near the placement surface 21 (a placement surface near region 22) of the ceramic base body 2 is the portion where a Mn content is $1 \times 10$-4% by mass or less as illustrated in FIG. 1(*b*). Herein, the placement surface near region 22 is a region having a thickness of 0.01 to 0.2 mm from the placement surface 21, for example. The Mn content in this region is not the content (ratio) based on the entire ceramic base body 2 but the content (ratio) in the predetermined volume only in this region. The content can be determined by removing a predetermined portion in the placement surface near region 22 of the ceramic base body 2 by a known method, such as grinding, cutting, or polishing, measuring the removed portion by an ICP mass spectrometry (ICP-MS) method, and then calculating the content in terms of the entire content of the placement surface 21 and the region near the placement surface 21 (placement surface near region 22).

Figure 2:
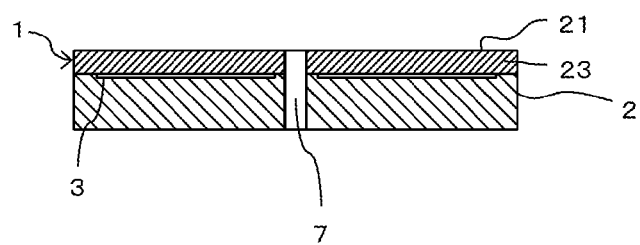
FIG. 2 illustrates (a) and (b) which are longitudinal sections indicating an electrostatic chuck according to another embodiment of the present invention.
Figure 2:
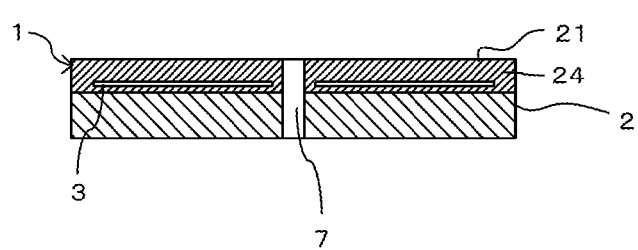

Herein, when the adsorption electrode 3 is provided inside of the ceramic base body 2, the Mn content in a region (placement surface side region 23) from the upper surface (placement surface 21) of the ceramic base body 2 to the adsorption electrode 3 is preferably $1 \times 10$-4% by mass or less as illustrated in FIG. 2(*a*). More specifically, the Mn content is preferably $1 \times 10$-4% by mass or less in the entire region from the placement surface 21 to the adsorption electrode 3 in the ceramic base body 2. The thickness of the ceramic base body 2 is usually 2 to 10 mm and the thickness of the placement surface side region 23 from the placement surface 21 to the adsorption electrode 3 is usually 0.2 to 0.4 mm.

Thus, the increase in residual adsorption with time in which the residual adsorption gradually increases after turning off the voltage is further suppressed and a wafer is more easily removed. This is because the field intensity is highest in a portion between the subject to be processed A and the adsorption electrode 3 to which a voltage is applied, and therefore leakage current can be more effectively suppressed by reducing the number of positive holes generated in the region from the placement surface 21 to the adsorption electrode 3 as much as possible.

In the case where the adsorption electrode 3 is provided inside of the ceramic base body 2, the Mn content in a region (placement surface side region 24) from the upper surface (placement surface 21) of the ceramic base body 2 to the vicinity of the lower surface of the adsorption electrode 3 is preferably 1×10-4% by mass or less as illustrated in FIG. 2(b). More specifically, the Mn content is preferably 1×10-4% by mass or less in the entire region from the placement surface 21 to the vicinity of the lower surface of the adsorption electrode 3 in the ceramic base body 2. The thickness of the ceramic base body 2 is usually 2 to 10 mm and the thickness of the region (placement surface side region 24) from the placement surface 21 to the vicinity of the lower surface of the adsorption electrode is usually 0.3 to 1.9 mm and the thickness from the lower surface of the adsorption electrode 3 in this region is 0.1 to 1.5 mm.

Thus, a subject to be processed is further not easily affected by the leakage current, and stable processing can be performed. This is because when a voltage is applied between the subject to be processed A and the adsorption electrode 3, the number of positive holes does not increase also in the region near the lower surface of the adsorption electrode 3 where an electric field directing toward the subject to be processed A is generated, and therefore leakage current can be further suppressed.

The ceramic base body 2 preferably contains polycrystal. This improves thermal uniformity. This is because, by the use of polycrystal, the orientation of a crystal as in a single crystal is not present, and therefore heat is transferred uniformly.

The Mn content in a crystal grain boundary phase in the ceramic base body 2 is preferably 1×10-4% by mass or less. With this, a wafer is more easily removed. This is because the residual adsorption can be suppressed by reducing the amount of Mn present in the grain boundary which is a path of electricity. Since Mn is likely to remain in the crystal grain boundary, it is preferable, for achieving the above-described state, to devise ways, for example, using a material in which the amount of impurity Mn is reduced when producing powder of the raw materials to be formed into the ceramic base body 2. The establishment of such a state can be confirmed by using a transmission electron microscope (TEM).

Figure 3:
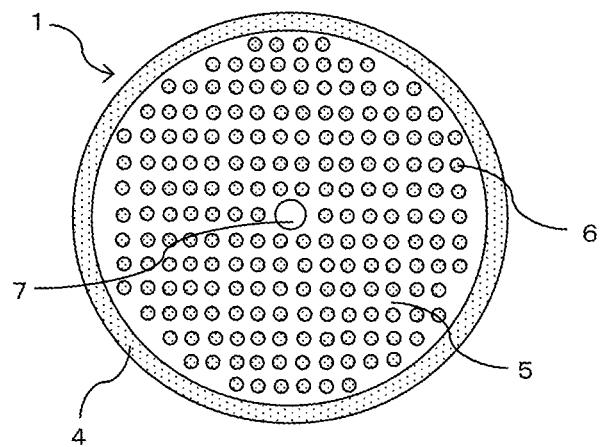
FIG. 3 illustrates views of an electrostatic chuck according to another embodiment of the present invention, in which (a) is a top view of the electrostatic chuck and (b) is a longitudinal section of the electrostatic chuck and a subject to be processed.
Figure 3:
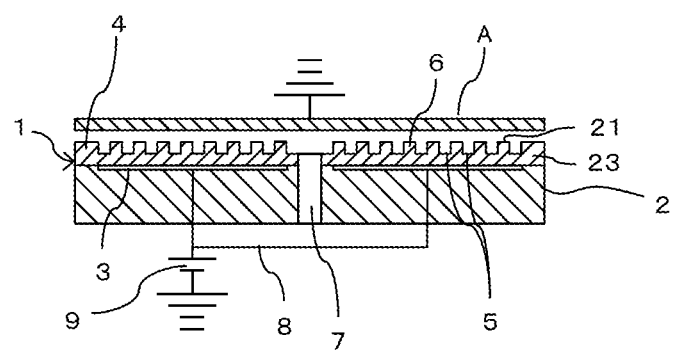

As illustrated in FIG. 3, it is preferable that a plurality of convex portions 6 are formed in the upper surface of the ceramic base body 2.

Specifically, the tip of each of the plurality of convex portions 6 is a flat surface, and each surface forms the placement surface 21. The height of the convex portions 6 is 3 to 50 μm, for example, and the number of the convex portions 6 is not limited to the number of the pattern illustrated in the figure. In this case, a gas flow path 5 is formed between the convex portions 6, and the gas flow paths 5 and the gas introduction hole 7 communicate with each other. In the electrostatic chuck 1 illustrated in FIG. 3, a peripheral wall 4 is formed along the periphery of one principal surface of the ceramic base body 2 and a space formed by the convex portions 6, the subject to be processed A, and the gas flow paths 5 is a closed space, so that a coolant gas supplied from the gas introduction hole 7 is prevented from leaking to the outside. The peripheral wall 4 may or may not be provided according to the purpose. The peripheral wall 4 may be formed integrally with the ceramic base body 2 or may be formed in another body.

Thus, a wafer is easily removed and particles can be suppressed. This is because the contact area of a wafer can be reduced and wearing of the subject to be processed can be suppressed.

Figure 4:
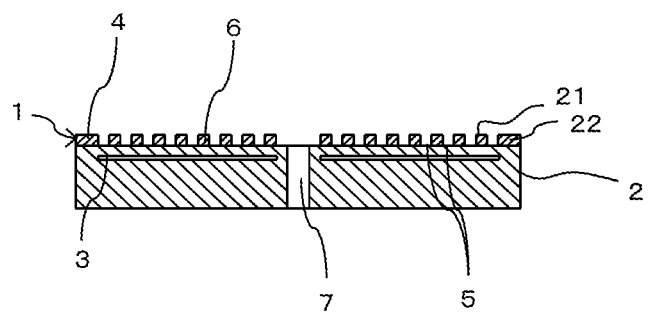
FIG. 4 illustrates (a), (b), (c), and (d) which are longitudinal sections indicating an electrostatic chuck according to another embodiments of the present invention.
Figure 4:
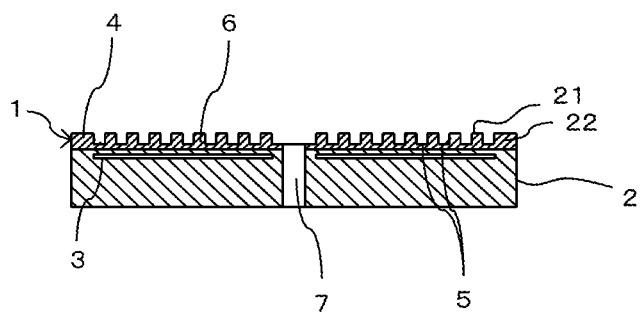
Figure 4:
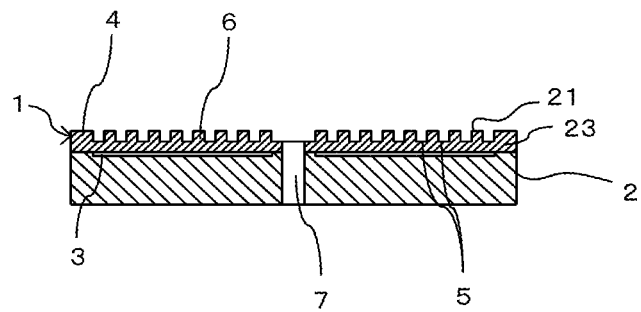
Figure 4:
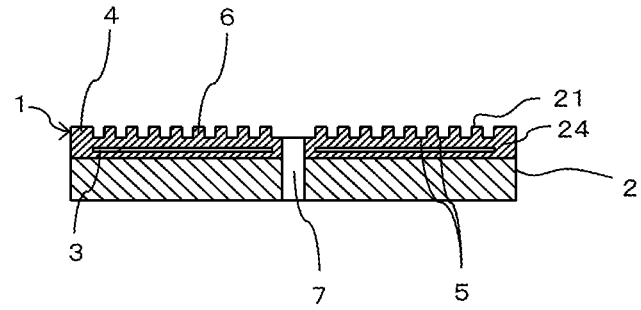

Examples of the portion having a Mn content of 1×10-4% by mass or less when the plurality of convex portions 6 are provided in the upper surface of the ceramic base body 2 include, for example, only the convex portions 6 as illustrated in FIG. 4(a), the convex portions 6 and the region near the placement surface 21 (placement surface near region 22) as illustrated in FIG. 4(b), and the like. The portion is preferably a region from the upper surface (placement surface 21) to the adsorption electrode 3 in the ceramic base body 2 (placement surface side region 23) as illustrated in FIG. 4(c) and is preferably a region from the upper surface (placement surface 21) to the vicinity of the lower surface of the adsorption electrode 3 in the ceramic base body 2 (placement surface side region 24) as illustrated in FIG. 4(d).

The above-described embodiment is specifically described in order to further clarify the gist of the present invention and the present invention is not limited to this embodiment.

Hereinafter, a method for manufacturing the electrostatic chuck according to an embodiment of the present invention is described. Although the description is given taking Al2O3 as an example, the electrostatic chuck of the present invention can be manufactured by the same technique also in the case of using AlN, Al2O3-TiO2, or the like.

First, a predetermined amount of Al2O3 powder serving as the main raw material is weighed, and then is wet-crushed and mixed in a ball mill which is lined with resin, such as urethane or nylon, with ion exchange water, a solvent, such as an organic solvent, an organic dispersing agent, and balls containing metal or ceramics coated with resin, such as urethane or nylon, for 24 to 72 Hr. For the resin lining or the resin coated balls, the resin to be used may be selected as appropriate from resin which does not dissolve or swell in the solvent to be used.

Herein, in order to form the portion having a Mn content of 1×10-4% by mass or less, aluminum oxide synthesized from ammonium dawsonite (NH4AlCO3(OH)2) and aluminum oxide synthesized from high purity aluminum hydroxide having a Mn content of 1×10-4% by mass or less are preferably used, for example, as the main raw material of the Al2O3 powder. In order to form a region other than the portion described above, Al2O3 refined from bauxite and aluminum oxide synthesized from aluminum hydroxide having a Mn content of 1×10-4% by mass or more are preferably used as the main raw material of the Al2O3 powder. With respect to the Al2O3 powder as the main raw material, the amount of each of Mn, Fe, Cr, and the like present therein may be identified and quantified in advance by the ICP mass spectrometry (ICP-MS) method or the like.

Into the raw material slurry subjected to crushing and mixing as described above, a predetermined amount of an organic binder, such as polyvinyl alcohol, polyvinyl butyral, or acrylic resin, and a predetermined amount of each of a plasticizer and an antifoaming agent as auxiliary organic materials, are added, and the mixture is further mixed for 24 to 48 Hr. The organic-inorganic mixed slurry subjected to the mixing is molded into a ceramic green sheet having a thickness of 20 μm to 20 mm and particularly 100 to 300 μm by a doctor blade method, a calendar roll method, a press-molding method, an extrusion molding method, or the like. Specifically, a ceramic green sheet for forming the portion having a Mn content of 1×10-4% by mass or less and a ceramic green sheet for forming a region other than the portion are formed.

Then, a paste-like electrode material, such as platinum or tungsten, for forming the adsorption electrode 3 is printed and molded by a known screen-printing method or the like on the ceramic green sheet forming the ceramic base body 2.

Herein, a ceramic green sheet on which the paste-like electrode material is not printed and an electrode forming green sheet on which the paste-like electrode material is printed are overlapped and layered in such a manner that the adsorption electrode 3 is formed at a predetermined position in the ceramic base body 2. The ceramic green sheets are layered at a predetermined temperature while applying a pressure equal to or higher than the yield stress value of the ceramic green sheet. As a pressure application technique, known techniques, such as a uniaxial pressing method and an isostatic pressing method (dry process, wet process), may be used. In order to have the portion where a Mn content is 1×10-4% by mass or less in the region from the upper surface (placement surface 21) of the ceramic base body 2 to the adsorption electrode 3, the ceramic green sheet for forming the portion having a Mn content of 1×10-4% by mass or less may be disposed above the electrode forming green sheet on which the paste-like electrode material is printed. In order to have the Mn content of 1×10-4% by mass or less in the region from the upper surface (placement surface 21) of the ceramic base body 2 to the adsorption electrode 3, the ceramic green sheet for forming the portion having a Mn content of 1×10-4% by mass or less may be used for all the ceramic green sheets to be disposed above the electrode forming green sheet on which the paste-like electrode material is printed. In order to have the Mn content of 1×10-4% by mass or less in the region from the upper surface (placement surface 21) of the ceramic base body 2 to the vicinity of the lower surface of the adsorption electrode 3, the ceramic green sheet for forming the portion having a Mn content of 1×10-4% by mass or less is also used for the electrode forming green sheet on which the paste-like electrode material is printed and also a predetermined number of the ceramic green sheets for forming the portion having a Mn content of 1×10-4% by mass or less may be disposed below the electrode forming green sheet.

Next, the obtained laminate is fired at a predetermined temperature in a predetermined atmosphere, whereby the ceramic base body 2 in which the adsorption electrode 3 is embedded or formed on the lower surface is produced.

As a method for forming the convex portions 6 in the placement surface of the ceramic base body 2, known techniques, such as a sandblast method using a mask, a machining processing method, and an ultrasonic processing method, can be used, and thus the convex portions 6 having a height of 3 to 50 μm can be formed into a predetermined pattern shape.

By the above-described manufacturing method, the electrostatic chuck in which suppression of the residual adsorption does not deteriorate with time under a plasma environment can be produced.

EXAMPLE 1

The electrostatic chuck 1 of the present invention having the structure of FIG. 1 was produced as follows. Specifically, as the starting materials of the placement surface and the region near the placement surface of the ceramic base body, the following six kinds of materials were used. Manganese (II) monoxide having a purity of 99.9% by mass or higher as a powder reagent was added as appropriate, when required, and the confirmation and evaluation of the residual adsorption described later were carried out.

As Material 1, Al2O3 powder having a purity of 99.99% by mass or higher was used. The average particle diameter D50 of the Al2O3 powder was 0.1 μm and the final impurity Mn was 1×10-5% by mass in terms of metal.

As Material 2, one obtained by adding MgO powder, SiO2 powder, and CaO powder as a sintering aid to Al2O3 powder (average particle diameter D50 of 0.1 μm) having a purity of 99.99% by mass or higher was used in which the Al2O3 powder was 98% by mass and the total of the MgO power, the SiO2 power, and the CaO powder was 2% by mass. The final impurity Mn was 1×10-5% by mass in terms of metal.

As Material 3, AlN powder having a purity 99.9% by mass was used. The average particle diameter D50 of the AlN powder was 1.0 μm and the final impurity Mn was 1×10-5% by mass in terms of metal.

As Material 4, one obtained by adding TiO2 (Average particle diameter D50 of 0.6 μm) powder to Al2O3 powder (average particle diameter D50 of 0.1 μm) powder having a purity of 99.99% by mass or higher was used to produce Al2O3-TiO2 powder containing 99% by mass of the Al2O3 powder and 1% by mass of the TiO2 powder. The final impurity Mn was 1×10-5% by mass in terms of metal.

As Material 5, mullite (3Al2O3.2SiO2) powder having a purity of 99% by mass was used. The average particle diameter D50 of the mullite powder was 0.5 μm and the final impurity Mn was 1×10-5% by mass in terms of metal.

As Material 6, cordierite (2MgO.2Al2O3.5SiO2) powder having a purity of 99.9% by mass was used. The average particle diameter D50 of the cordierite powder was 0.7 μm and the final impurity Mn was 1×10-5% by mass in terms of metal.

Eighty parts by mass of toluene and 0.5 part by mass of a dispersing agent based on 100 parts by mass of Materials 1 to 6 above were wet-crushed and mixed for 48 Hr with φ 20 mm resin-coated balls in a ball mill lined with nylon. In the wet-crushing and mixing, materials in which powder of manganese(II) monoxide was added to each material in such a manner that Mn had a predetermined amount of $1\times10^{-4}$% by mass or 1×10-3% by mass in terms of metal were also separately prepared. Herein, one having a purity of 99.9% by mass manufactured by Kojundo Chemical Lab. Co., Ltd. was used as the manganese(II) monoxide, and the powder was obtained by pulverizing the same into fine powder in a vibrating mill beforehand.

With respect to a lower region other than the placement surface and the region near the placement surface of the ceramic base body, a material containing 1×10-3% by mass of Mn in terms of metal was applied.

Subsequently, a plasticizer and a binder were added to the wet-crushed and mixed slurry. As the plasticizer, 2 parts by mass of each of DBP and DOP based on 100 parts by mass of the raw material powder were added. As the binder, 12 parts by mass in terms of solid content of polyvinyl butyral based on 100 parts by mass of the raw material powder was added. Then, the mixture was further wet-mixed for 30 Hr.

Next, the organic-inorganic mixed slurry subjected to the mixing was molded into a 100 μm thick ceramic green sheet by a doctor blade method.

Next, a tungsten paste to be formed into the adsorption electrode was printed and molded on a ceramic green sheet to be formed into the ceramic base body by a screen printing method.

Next, a ceramic green sheet serving as the placement surface and the region near the placement surface on which the tungsten paste was not printed and an electrode forming green sheet on which the tungsten paste was printed were overlapped, and then laminated at a temperature of 80° C. or higher by a uniaxial pressing method while applying a pressure equal to or higher than the yield stress of the green sheet, specifically 5 MPa in such a manner that the adsorption electrode was formed at a predetermined position in the ceramic base body. In this case, the boundary between the placement surface and region near the placement surface and the lower region other than the placement surface and region near the placement surface was formed at a position under the placement surface by one layer of the ceramic green sheet (position about 50 μm distant from the placement surface after rotary grinding described later) between the placement surface and the adsorption electrode, and a green sheet in which the Mn content was adjusted to 1×10-3% by mass in terms of metal was used for the lower region as described above.

Next, the obtained laminate was fired at a predetermined temperature (1600° C. for the raw material powder of each of the materials other than Materials 3, 5, and 6, 2000° C. for the raw material powder of Material 3, and 1400° C. for the raw material powder of each of Materials 5 and 6) for 3 Hr in a reduction atmosphere.

The obtained ceramic base body was subjected to thickness processing by rotary grinding, a gas introduction hole was formed by machining processing, the placement surface was finished in such a manner that the surface roughness Ra was 0.1 μm or less by lapping processing, and gas flow paths having a height of 12 μm were formed into a predetermined pattern shape by a sandblast method using a mask. A metal terminal (not illustrated) was attached to the adsorption electrode by blazing to produce an electrostatic chuck.

Then, the following evaluation was carried out in a vacuum chamber heated with a halogen lamp in such a manner that the temperature of the adsorption surface of the produced electrostatic chuck was 140° C. The heating to 140° C. was performed for the purpose of further promoting the charge transfer (generation of positive holes) in Mn oxide.

In the evaluation, plasma treatment with 1 cycle of 70 seconds was repeated 3000 times to the adsorption surface of the electrostatic chuck, and then a predetermined voltage was applied to the adsorption electrode for 300 seconds to adsorb and fix a silicon wafer.

Thereafter, application of voltage to the adsorption electrode was stopped, and then the residual adsorption force one second after the termination of the voltage application was measured using a load cell. The measurement was performed with a master of single crystalline sapphire beforehand. Then, it was judged that one whose measurement result of 0.20 kPa or less in the value of the load cell did not have residual adsorption force. In all the samples, the residual adsorption force before the plasma treatment was less than 0.20 kPa, and the results after the plasma treatment were shown in Table 1.

TABLE 1

| Sample No. | Material | Material of ceramic base body | Mn content in placement surface and region near placement surface [% by mass] | Residual adsorption force [kPa] |
| --- | --- | --- | --- | --- |
| *1  | 1 | 99.9% $Al_2O_3$     | $1.0 \times 10^{-3}$ | 0.69 |
| 2   | 1 | 99.9% $Al_2O_3$     | $1.0 \times 10^{-4}$ | 0.17 |
| 3   | 1 | 99.9% $Al_2O_3$     | $1.0 \times 10^{-5}$ | 0.13 |
| *4  | 2 | 98% $Al_2O_3$       | $1.0 \times 10^{-3}$ | 0.63 |
| 5   | 2 | 98% $Al_2O_3$       | $1.0 \times 10^{-4}$ | 0.19 |
| 6   | 2 | 98% $Al_2O_3$       | $1.0 \times 10^{-5}$ | 0.17 |
| *7  | 3 | AlN                 | $1.0 \times 10^{-3}$ | 0.60 |
| 8   | 3 | AlN                 | $1.0 \times 10^{-4}$ | 0.17 |
| 9   | 3 | AlN                 | $1.0 \times 10^{-5}$ | 0.12 |
| *10 | 4 | $Al_2O_3$—$TiO_2$   | $1.0 \times 10^{-3}$ | 0.75 |
| 11  | 4 | $Al_2O_3$—$TiO_2$   | $1.0 \times 10^{-4}$ | 0.20 |
| 12  | 4 | $Al_2O_3$—$TiO_2$   | $1.0 \times 10^{-5}$ | 0.15 |
| *13 | 5 | Mullite             | $1.0 \times 10^{-3}$ | 0.75 |
| 14  | 5 | Mullite             | $1.0 \times 10^{-4}$ | 0.19 |
| 15  | 5 | Mullite             | $1.0 \times 10^{-5}$ | 0.15 |
| *16 | 6 | Cordierite          | $1.0 \times 10^{-3}$ | 0.69 |
| 17  | 6 | Cordierite          | $1.0 \times 10^{-4}$ | 0.17 |
| 18  | 6 | Cordierite          | $1.0 \times 10^{-5}$ | 0.12 |

*marks show samples outside the scope of the present invention.

According to Table 1, in the samples (samples in which the Mn amount in the placement surface and the region near the placement surface is 1×10-4% by mass or less) of Examples of the present invention other than Samples No. 1, 4, 7, 10, 13, and 16, the residual adsorption force after the plasma treatment is 0.20 kPa or less, which shows that the increase in residual adsorption force is effectively suppressed.

On the other hand, it is found that the residual adsorption is noticeably generated after the plasma treatment in Samples No. 1, 4, 7, 10, 13, and 16 which are comparative examples (samples in which the Mn amount in the placement surface and the region near the placement surface exceeds 1×10-4% by mass).

From the description above, it was able to be confirmed that the increase in residual adsorption force can be suppressed by adjusting the Mn content in the placement surface and the region near the placement surface to be 1×10-4% by mass or less, irrespective of the compositions of Materials 1 to 6.

EXAMPLE 2

The electrostatic chucks 1 of the present invention having the structures of FIG. 2(a) and FIG. 2(b) were produced by the same technique as that of Example 1 using Materials 1 to 6 of Example 1 for the starting materials of a region from the upper surface (placement surface) to the adsorption electrode (placement surface side region) in the ceramic base body or a region from the upper surface (placement surface) to the vicinity of the lower surface of the adsorption electrode (placement surface side region) in the ceramic base body. In wet-crushing and mixing, materials in which powder of manganese(II) monoxide was added to each material in such a manner that Mn had a predetermined amount of 1×10-4% by mass or 1×10-3% by mass in terms of metal were also separately prepared in the same manner as in Example 1.

A material having a Mn content of 1×10-3% by mass in terms of metal was applied to the lower region other than the region from the upper surface to the adsorption electrode (FIG. 2(a)) or other than the region from the upper surface to the vicinity of the lower surface of the adsorption electrode (FIG. 2(b)) in the ceramic base body.

The electrostatic chuck equivalent to that of FIG. 2(b) was a sample in which a ceramic green sheet having a Mn content of 1×10-4% by mass was overlapped on the lower surface (surface opposite to the placement surface) of the adsorption electrode in such a manner that the thickness after firing was 0.5 mm.

Then, the following evaluation was carried out in the same manner as in Example 1 in a vacuum chamber heated with a halogen lamp in such a manner that the temperature of the adsorption surface of the produced electrostatic chuck was 140° C.

In the evaluation, plasma treatment with 1 cycle of 70 seconds was repeated 3000 times to the adsorption surface of the electrostatic chuck, and then a predetermined voltage was applied to the adsorption electrode for 300 seconds to adsorb and fix a silicon wafer.

Thereafter, application of voltage to the adsorption electrode was stopped, and then the residual adsorption force one second after the termination of the voltage application was measured using a load cell. The residual adsorption force before the plasma treatment was less than 0.20 kPa in all the samples. These results are shown in Table 2. In order to further facilitate the understanding of the effects, the results of Table 1 are also partially shown again.

that the increase in residual adsorption force is more effectively suppressed in the case where the boundary between the region having a Mn content of 1×10-4% by mass and the other regions is set to the position at the adsorption electrode than in the case where the boundary is set to the position in a region from the placement surface to a portion under the placement surface by one layer of the green sheet (position about 50 μm distant from the placement surface after rotary grinding).

Furthermore, as is clarified from the comparisons between Sample No. 2 and Sample No. 3, Sample No. 5 and Sample No. 6, Sample No. 8 and Sample No. 9, Sample No. 11 and Sample No. 12, Sample No. 14 and Sample No. 15, Sample No. 17 and Sample No. 18, Sample No. 20 and Sample No. 21, and Sample No. 23 and Sample No. 24, it is found that the increase in residual adsorption force is more effectively suppressed in the case where the boundary between the region having a Mn content of 1×10-4% by mass and the other regions is set to the position at 0.5 mm under the adsorption electrode than in the case where the boundary is set to the position at the adsorption electrode.

From the above description, it was able to be confirmed that, in order to more effectively suppress the increase in

TABLE 2

| Sample No. | Material | Material of ceramic base body | Mn content of placement surface side region [% by mass] | Position of boundary between placement surface side region and region other than placement surface side region | Residual adsorption force [kPa] |
|---|---|---|---|---|---|
| 1 | 1 | 99.9% $Al_2O_3$ | $1.0 \times 10^{-4}$ | Under placement surface by one layer of green sheet | 0.17 |
| 2 | 1 | 99.9% $Al_2O_3$ | $1.0 \times 10^{-4}$ | Adsorption electrode | 0.12 |
| 3 | 1 | 99.9% $Al_2O_3$ | $1.0 \times 10^{-4}$ | 0.5 mm under adsorption electrode | 0.07 |
| 4 | 1 | 99.9% $Al_2O_3$ | $1.0 \times 10^{-5}$ | Under placement surface by one layer of green sheet | 0.13 |
| 5 | 1 | 99.9% $Al_2O_3$ | $1.0 \times 10^{-5}$ | Adsorption electrode | 0.09 |
| 6 | 1 | 99.9% $Al_2O_3$ | $1.0 \times 10^{-5}$ | 0.5 mm under adsorption electrode | 0.03 |
| 7 | 2 | 98% $Al_2O_3$ | $1.0 \times 10^{-4}$ | Under placement surface by one layer of green sheet | 0.19 |
| 8 | 2 | 98% $Al_2O_3$ | $1.0 \times 10^{-4}$ | Adsorption electrode | 0.15 |
| 9 | 2 | 98% $Al_2O_3$ | $1.0 \times 10^{-4}$ | 0.5 mm under adsorption electrode | 0.11 |
| 10 | 2 | 98% $Al_2O_3$ | $1.0 \times 10^{-5}$ | Under placement surface by one layer of green sheet | 0.17 |
| 11 | 2 | 98% $Al_2O_3$ | $1.0 \times 10^{-5}$ | Adsorption electrode | 0.08 |
| 12 | 2 | 98% $Al_2O_3$ | $1.0 \times 10^{-5}$ | 0.5 mm under adsorption electrode | 0.04 |
| 13 | 3 | AlN | $1.0 \times 10^{-4}$ | Under placement surface by one layer of green sheet | 0.17 |
| 14 | 3 | AlN | $1.0 \times 10^{-4}$ | Adsorption electrode | 0.12 |
| 15 | 3 | AlN | $1.0 \times 10^{-4}$ | 0.5 mm under adsorption electrode | 0.09 |
| 16 | 4 | $Al_2O_3$—$TiO_2$ | $1.0 \times 10^{-4}$ | Under placement surface by one layer of green sheet | 0.20 |
| 17 | 4 | $Al_2O_3$—$TiO_2$ | $1.0 \times 10^{-4}$ | Adsorption electrode | 0.17 |
| 18 | 4 | $Al_2O_3$—$TiO_2$ | $1.0 \times 10^{-4}$ | 0.5 mm under adsorption electrode | 0.12 |
| 19 | 5 | Mullite | $1.0 \times 10^{-4}$ | Under placement surface by one layer of green sheet | 0.19 |
| 20 | 5 | Mullite | $1.0 \times 10^{-4}$ | Adsorption electrode | 0.17 |
| 21 | 5 | Mullite | $1.0 \times 10^{-4}$ | 0.5 mm under adsorption electrode | 0.12 |
| 22 | 6 | Cordierite | $1.0 \times 10^{-4}$ | Under placement surface by one layer of green sheet | 0.17 |
| 23 | 6 | Cordierite | $1.0 \times 10^{-4}$ | Adsorption electrode | 0.15 |
| 24 | 6 | Cordierite | $1.0 \times 10^{-4}$ | 0.5 mm under adsorption electrode | 0.09 |

According to Table 2, as is clarified from the comparisons between Sample No. 1 and Sample No. 2, Sample No. 4 and Sample No. 5, Sample No. 7 and Sample No. 8, Sample No. 10 and Sample No. 11, Sample No. 13 and Sample No. 14, Sample No. and Sample No. 17, Sample No. 19 and Sample No. 20, and Sample No. 22 and Sample No. 23, it is found residual adsorption force, the increase in residual adsorption force can be further suppressed by setting the Mn content in the region, to which a voltage (electric field) is applied, to be 1×10-4% by mass or less, irrespective of the compositions of Materials 1 to 6.

EXAMPLE 3

In the electrostatic chuck 1 of the present invention containing Material 1 as the starting material and having the structure of FIG. 2(a) produced in Example 2, the lower surface (surface opposite to the placement surface) containing the adsorption electrode was ground by rotary grinding. The thickness from the placement surface of the obtained ceramic base body was 0.35 mm.

As a comparison, 0.35 mm thick ceramic substrates having the same structure as that of the above-described electrostatic chuck were produced with single crystalline sapphire.

On each ceramic substrate, the same adsorption electrode as that of the electrostatic chucks of Examples 1 and 2 was formed by a Cr vapor-deposition method.

Then, a metal terminal (not illustrated) was attached to the adsorption electrode with an Ag epoxy conductive adhesive to produce an electrostatic chuck and also the electrostatic chuck was further bonded to a cooling base plate (not illustrated).

Then, the following evaluation was carried out in the same manner as in Examples 1 and 2 in a vacuum chamber heated with a halogen lamp in such a manner that the temperature of the adsorption surface of the produced electrostatic chuck was 140° C.

In the evaluation, plasma treatment with 1 cycle of 70 seconds was repeated 3000 times to the adsorption surface of the electrostatic chuck, and then a predetermined voltage was applied to the adsorption electrode for 300 seconds to adsorb and fix a silicon wafer. Thereafter, application of voltage to the adsorption electrode was stopped, and then the residual adsorption force one second after the termination of the voltage application was measured using a load cell. The residual adsorption force before the plasma treatment was less than 0.20 kPa in all the samples.

Furthermore, a high frequency RF of 15 MHz was applied to the base plate in each sample, the temperature of the electrostatic chuck surface was measured with an infrared thermometer, and then a difference ($\Delta T$) between the highest temperature and the lowest temperature was evaluated.

These results are shown in Table 3.

TABLE 3

| Sample No. | Material | Material of ceramic base body | Mn content of placement surface side region [% by mass] | Residual adsorption force [kPa] | In-plane thermal uniformity $\Delta T$ [° C.] |
|---|---|---|---|---|---|
| 1 | 1 | 99.9% $Al_2O_3$ | $1.0 \times 10^{-4}$ | 0.08 | 0.8 |
| *2 |  | Sapphire | 0 | 0.09 | 2.4 |

*marks show samples outside the scope of the present invention.

As is clear from Table 3, it is found that the thermal uniformity ($\Delta T$) in the adsorption surface under a high frequency environment is better in the electrostatic chuck produced with polycrystalline alumina of Sample 1 which is Example of the present invention than in the electrostatic chuck produced with single crystalline sapphire of Sample 2 which is a comparative example. This is because, by the use of polycrystal for the ceramic base body, the orientation of a crystal as in a single crystal is not present, and therefore heat is transferred uniformly.

In the electrostatic chuck of Sample 1, since the Mn amount is 1×10-4% by mass in the region (placement surface side region) from the upper surface (placement surface) to the adsorption electrode in the ceramic base body, suppression of the residual adsorption did not deteriorate with time.

With respect to the electrostatic chuck of Sample 1, when the cross section of the ceramic base body was observed under a transmission electron microscope (TEM), 1×10-4% by mass of Mn are all present in the grain boundary, and thus it was confirmed that the grain boundary was a path of positive holes. Therefore, it is found that the increase in residual adsorption can be suppressed by reducing the amount of Mn present in the grain boundary which is a path of electricity.

REFERENCE SIGNS LIST

1: Electrostatic chuck
2: Ceramic base body
21: Placement surface
22: Placement surface near region
23, 24: Placement surface side region
3: Adsorption electrode
4: Peripheral wall
5: Gas flow path
6: Convex portion
7: Gas introduction hole
8: Lead
9: Direct-current power supply

The invention claimed is:

1. An electrostatic chuck, comprising:
a ceramic base body; and
an adsorption electrode provided inside of or on a lower surface of the ceramic base body, wherein
the electrostatic chuck has a portion where a manganese content is $1 \times 10^{-4}$% by mass or less in a region from an upper surface of the ceramic base body to the adsorption electrode.

2. The electrostatic chuck according to claim 1, wherein the adsorption electrode is provided inside of the ceramic base body and the manganese content in the region from the upper surface to the adsorption electrode is $1 \times 10^{-4}$% by mass or less.

3. The electrostatic chuck according to claim 1, wherein the adsorption electrode is provided inside of the ceramic base body and the manganese content in a region from the upper surface to a vicinity of a lower surface of the adsorption electrode is $1 \times 10^{-4}$% by mass or less.

4. The electrostatic chuck according to claim 1, wherein the ceramic base body contains polycrystal.

5. The electrostatic chuck according to claim 4, wherein the manganese content in a crystal grain boundary phase in the ceramic base body is $1 \times 10^{-4}$% by mass or less.

6. The electrostatic chuck according to claim 1, wherein a plurality of convex portions are formed in the upper surface of the ceramic base body.

* * * * *